United States Patent
Son et al.

(10) Patent No.: US 12,469,730 B2
(45) Date of Patent: Nov. 11, 2025

(54) DISPLAY PANEL MANUFACTURING APPARATUS AND DISPLAY PANEL MANUFACTURING METHOD USING THE SAME

(71) Applicant: Samsung Display Co., LTD., Yongin-si (KR)

(72) Inventors: Byung Kyu Son, Yongin-si (KR); Dae Hong Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 632 days.

(21) Appl. No.: 17/876,377

(22) Filed: Jul. 28, 2022

(65) Prior Publication Data

US 2023/0125730 A1    Apr. 27, 2023

(30) Foreign Application Priority Data

Oct. 26, 2021    (KR) .......................... 10-2021-0144030

(51) Int. Cl.
*H01L 21/68* (2006.01)
*H01L 21/67* (2006.01)
*H01L 23/00* (2006.01)
*H01L 25/16* (2023.01)

(52) U.S. Cl.
CPC ........ *H01L 21/68* (2013.01); *H01L 21/67259* (2013.01); *H01L 24/95* (2013.01); *H01L 25/167* (2013.01); *H01L 24/24* (2013.01); *H01L 24/25* (2013.01); *H01L 2224/24051* (2013.01); *H01L 2224/24146* (2013.01); *H01L 2224/25175* (2013.01); *H01L 2224/95102* (2013.01); *H01L 2224/95133* (2013.01)

(58) Field of Classification Search
CPC .... B41J 2/0456; B41J 2/2135; B41J 2/04558; B41J 2/04586; B41J 2202/09; H10H 20/01; H10H 20/819; H10H 20/857; H01L 25/0753; H10K 71/135
See application file for complete search history.

(56) References Cited

U.S. PATENT DOCUMENTS

| | | | |
|---|---|---|---|
| 11,543,472 B2 * | 1/2023 | Ellis, Jr. ................. | H04L 9/3263 |
| 11,685,154 B2 * | 6/2023 | Lee ......................... | B41J 2/0456 |
| | | | 347/14 |
| 11,688,314 B2 | 6/2023 | Lee et al. | |
| 12,100,689 B2 | 9/2024 | Kang et al. | |

(Continued)

FOREIGN PATENT DOCUMENTS

KR  10-0436776 B1  6/2004
KR  10-2020-0026385 A  3/2020

(Continued)

*Primary Examiner* — Jarrett J Stark
(74) *Attorney, Agent, or Firm* — Womble Bond Dickinson (US) LLP

(57) ABSTRACT

A display panel manufacturing apparatus and a display panel manufacturing method are provided. A display panel manufacturing apparatus manufactures a display panel which is on a lower stage and includes light emitting elements. The display panel manufacturing apparatus includes: a power supply for supplying an alignment voltage for aligning the light emitting elements on the display panel; and an upper stage including a probe unit to provide the alignment voltage to the display panel and magnetic sensors to sense an alignment state of the light emitting elements.

7 Claims, 11 Drawing Sheets

(56) References Cited

U.S. PATENT DOCUMENTS

| | | | |
|---|---|---|---|
| 2002/0032531 A1* | 3/2002 | Mansky | B01J 19/0046 |
| | | | 702/21 |
| 2006/0022666 A1* | 2/2006 | Hughes | B21J 15/28 |
| | | | 324/67 |
| 2019/0304950 A1* | 10/2019 | Israel | H01L 24/97 |
| 2022/0080725 A1* | 3/2022 | Lee | B41J 2/04558 |
| 2023/0125730 A1* | 4/2023 | Son | H01L 24/95 |
| | | | 438/15 |
| 2024/0102153 A1* | 3/2024 | Zhang | C23C 14/50 |
| 2024/0404864 A1* | 12/2024 | Motoyoshi | H10H 29/30 |

FOREIGN PATENT DOCUMENTS

| | | |
|---|---|---|
| KR | 10-2020-0034905 A | 4/2020 |
| KR | 10-2020-0084476 A | 7/2020 |

\* cited by examiner

DISPLAY PANEL MANUFACTURING APPARATUS AND DISPLAY PANEL MANUFACTURING METHOD USING THE SAME

CROSS-REFERENCE TO RELATED APPLICATION

This application claims priority to and the benefit of Korean Patent Application No. 10-2021-0144030, filed on Oct. 26, 2021 in the Korean Intellectual Property Office, the entire disclosure of which is incorporated by reference herein.

BACKGROUND

1. Field

Aspects of embodiments of the present disclosure relate to a display panel manufacturing apparatus and a display panel manufacturing method using the same.

2. Description of the Related Art

As interest in information displays and demand for portable information media increase, research and commercialization has focused on display devices.

SUMMARY

According to aspects of embodiments of the present disclosure, a display panel manufacturing apparatus and a display panel manufacturing method using the same, which can simplify a display panel manufacturing process and shorten a manufacturing time, are provided.

According to one or more embodiments of the present disclosure, a display panel manufacturing apparatus for manufacturing a display panel which is on a lower stage and includes light emitting elements includes: a power supply configured to supply an alignment voltage for aligning the light emitting elements on the display panel; and an upper stage including a probe unit to provide the alignment voltage to the display panel and magnetic sensors to sense an alignment state of the light emitting elements.

The magnetic sensors may be located on the upper stage while being spaced apart from each other.

When the alignment voltage is applied, the magnetic sensors may sense a magnetic field change occurring at both end portions of the light emitting elements.

The magnetic sensors may include a hole sensor or a magnetoresistive sensor.

A size and a shape of the magnetic sensors may be determined corresponding to a unit sensing area of the display panel.

The unit sensing area may be an area defined to sense the alignment state of the light emitting elements on the display panel.

The probe unit may be located at both sides of the upper stage to be spaced apart from the magnetic sensors.

According to one or more embodiments of the present disclosure, a display panel manufacturing method includes: arranging, on a lower stage, a mother substrate in which a first electrode and a second electrode are located, and spraying an ink including light emitting elements onto the mother substrate; and applying an alignment voltage for aligning the light emitting elements on the mother substrate, and sensing an alignment state of the light emitting elements by sensing a magnetic field change of the light emitting elements.

When the magnetic field change of the light emitting elements is sensed, it may be determined that the light emitting elements have been aligned. When the magnetic field change of the light emitting elements is not sensed, it may be determined that the light emitting elements have been misaligned.

The alignment voltage may be applied such that a first end portion of a light emitting element of the light emitting elements is aligned to face the first electrode and a second end portion of the light emitting element is aligned to face the second electrode.

A first alignment voltage may be applied to the first electrode, and a second alignment voltage may be applied to the second electrode.

The first alignment voltage may be a ground voltage, and the second alignment voltage may be an AC voltage.

According to one or more embodiments of the present disclosure, a display panel manufacturing method using a display panel manufacturing apparatus including a power supply for supplying an alignment voltage for aligning light emitting elements on a display panel arranged on a lower stage and an upper stage including a probe unit providing the alignment voltage to the display panel and magnetic sensors sensing an alignment state of the light emitting elements includes: arranging, on the lower stage, a mother substrate in which a first electrode and a second electrode are located, and spraying an ink including light emitting elements onto the mother substrate; and applying an alignment voltage for aligning the light emitting elements on the mother substrate, and sensing an alignment state of the light emitting elements by sensing a magnetic field change of the light emitting elements.

The magnetic sensors may be located on the upper stage while being spaced apart from each other.

When the alignment voltage is applied, the magnetic sensors may sense a magnetic field change occurring at both end portions of the light emitting elements.

The magnetic sensors may include a hole sensor or a magnetoresistive sensor.

A position and a number of the probe unit may be determined corresponding to a probe pad located on the mother substrate.

When the magnetic field change of the light emitting elements is sensed, it may be determined that the light emitting elements have been aligned. When the magnetic field change of the light emitting elements is not sensed, it may be determined that the light emitting elements have been misaligned.

A first alignment voltage may be applied to the first electrode, and a second alignment voltage may be applied to the second electrode.

The first alignment voltage may be a ground voltage, and the second alignment voltage may be an AC voltage.

BRIEF DESCRIPTION OF THE DRAWINGS

Some example embodiments will now be described more fully herein with reference to the accompanying drawings; however, the present disclosure may be embodied in different forms and should not be construed as limited to the embodiments set forth herein. Rather, these example embodiments are provided so that this disclosure will be thorough and complete, and will fully convey the scope of the embodiments to those skilled in the art.

DETAILED DESCRIPTION

Figure 1:
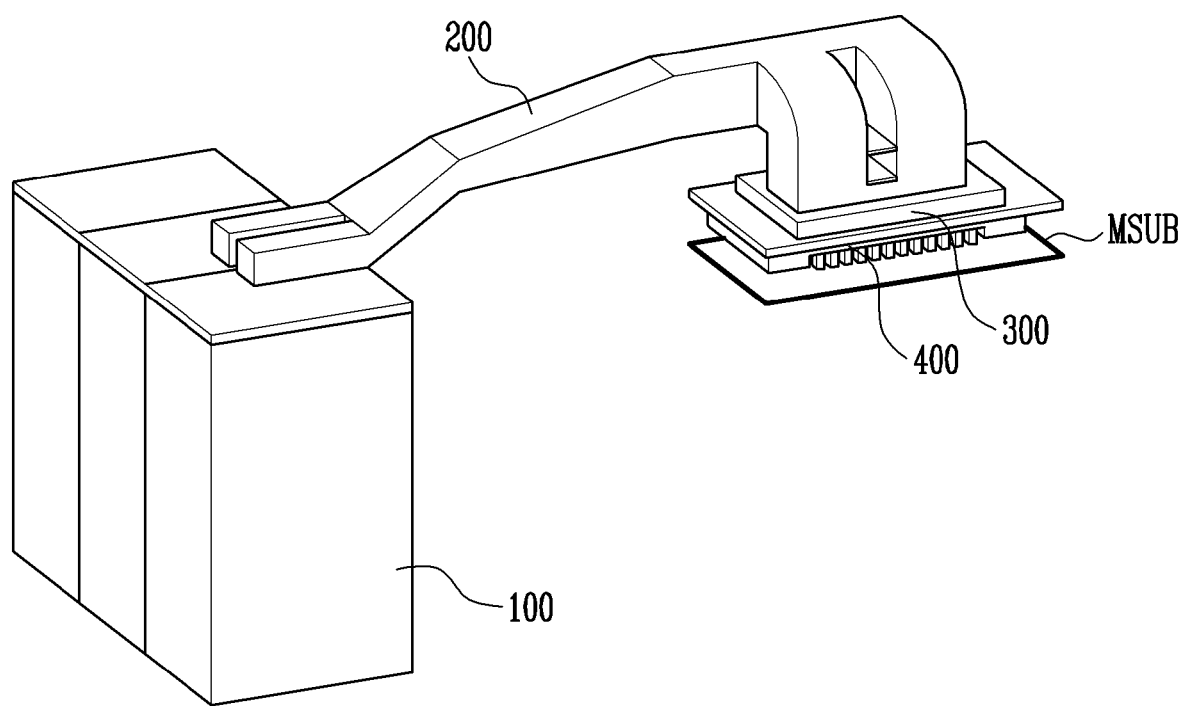
FIG. 1 is a perspective view illustrating a display panel manufacturing apparatus in accordance with an embodiment of the present disclosure.

The embodiments described in the present specification are intended to clearly explain the concept of the present invention to a person of ordinary skill in the art; however, it is to be understood that the present invention is not limited to the embodiments described in the present specification, and it will be understood by a person of ordinary skill in the art that various modifications and changes may be made without departing from the spirit and scope of the present invention. The accompanying drawings are provided in order to allow embodiments disclosed in the present specification to be easily understood, and the shapes shown in the drawings may be exaggerated and displayed so as to aid understanding of the present invention, and the present invention is not limited to the drawings.

It is to be understood that, although the terms "first," "second," etc. may be used herein to describe various elements, these elements should not be limited by these terms. These terms are used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It is to be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof. Further, an expression that an element, such as a layer, region, substrate, or plate, is placed "on" or "above" another element indicates not only a case in which the element is placed "directly on" or "just above" the other element but also a case in which one or more further elements are interposed between the element and the other element. Similarly, an expression that an element, such as a layer, region, substrate, or plate, is placed "beneath" or "below" another element indicates not only a case in which the element is placed "directly beneath" or "just below" the other element but also a case in which one or more further elements are interposed between the element and the other element.

In the drawing figures, dimensions may be exaggerated for clarity of illustration. It is to be understood that when an element is referred to as being "between" two elements, it may be the only element between the two elements, or one or more intervening elements may also be present. Like reference numerals refer to like elements throughout.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Herein, a display panel manufacturing apparatus in accordance with an embodiment of the present disclosure will be described in further detail with reference to the accompanying drawings.

FIG. 1 is a perspective view illustrating a display panel manufacturing apparatus in accordance with an embodiment of the present disclosure.

Referring to FIG. 1, a display panel manufacturing apparatus in accordance with an embodiment of the present disclosure may include a power supply 100, a connecting part 200, a coupling part 300, and an upper stage 400.

The power supply 100 is a power supply device, and may supply power to manufacture a display panel. In an example, the power supply 100 may supply an alignment voltage for aligning light emitting elements on the display panel. The alignment voltage may be supplied in the form of a DC voltage, an AC voltage, or the like.

The connecting part 200 may be physically and/or electrically connected to the power supply 100, and may be physically and/or electrically connected to the coupling part 300 which will be described later, to connect the power supply 100 and the coupling part 300 to each other. In an example, the connecting part 200 may be a cable duct.

The coupling part 300 may be physically and/or electrically connected to the connecting part 200, and may be physically and/or electrically connected to the upper stage 400 which will be described later, to connect the connecting part 200 and the upper stage 400 to each other. In an example, the coupling part 300 may be a docking system.

The upper stage 400 may be physically and/or electrically connected to the coupling part 300, and be located to overlap with a mother substrate MSUB. The mother substrate MSUB is a substrate which becomes a base of a display panel. In an embodiment, the display panel may be manufactured by cutting the mother substrate MSUB along a cutting line (e.g., a predetermined cutting line).

The upper stage 400 may include magnetic sensors for sensing an alignment state of the light emitting elements on the display panel. Also, the upper stage 400 may include a probe unit for providing an alignment voltage to the display panel. The probe unit may be in contact with a probe pad on the mother substrate MSUB, and may provide an alignment voltage to the probe pad. The upper stage will be described in further detail with reference to FIG. 2, which will be described later.

Herein, the display panel manufacturing apparatus described with reference to FIG. 1 and a display panel manufactured using the same will be described with reference to FIGS. 2 to 4.

Figure 2:
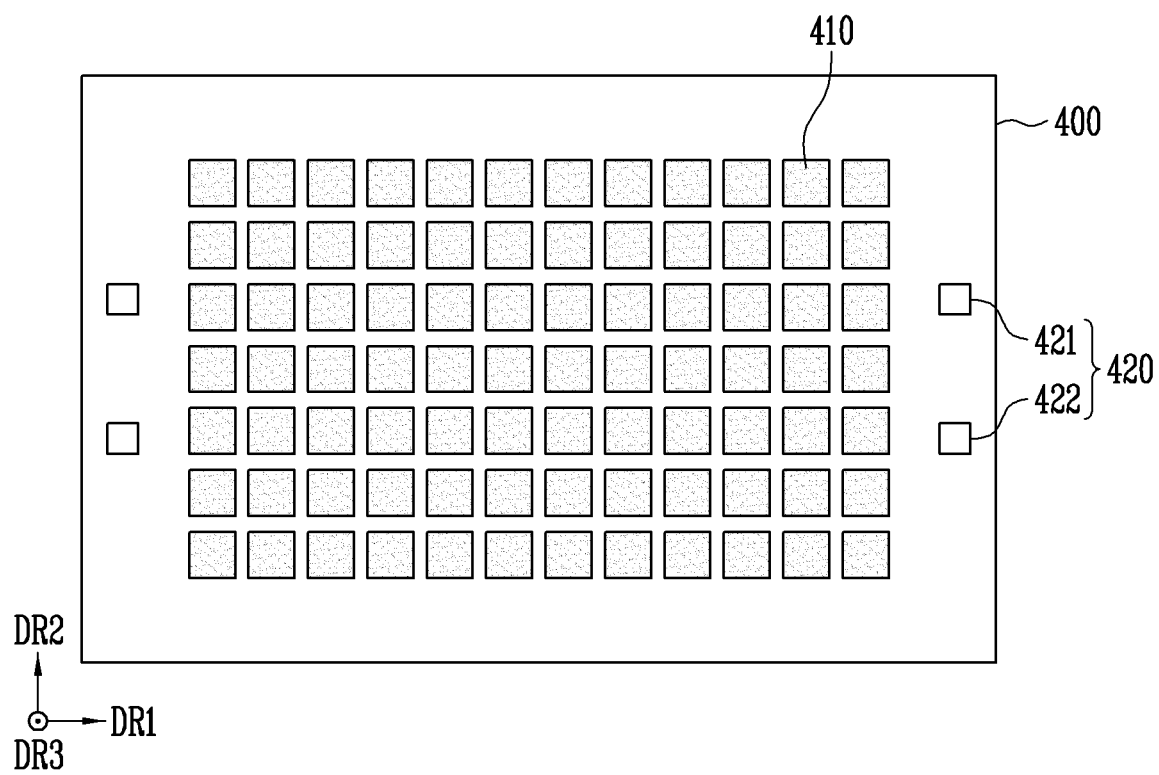
FIG. 2 is a plan view illustrating an upper stage shown in FIG. 1.
Figure 3:
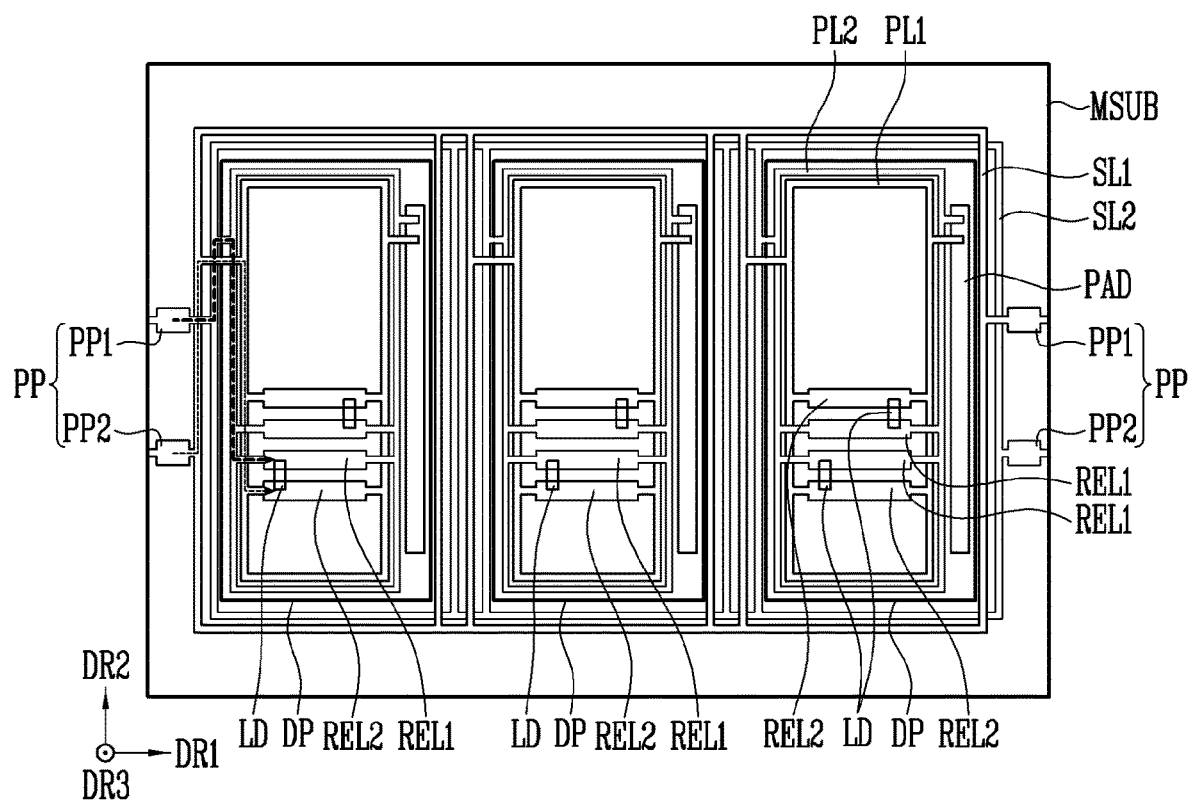
FIG. 3 is a plan view illustrating a display panel in accordance with an embodiment of the present disclosure.

FIG. 2 is a plan view illustrating the upper stage shown in FIG. 1. FIG. 3 is a plan view illustrating a display panel in accordance with an embodiment of the present disclosure.

Referring to FIG. 2, in accordance with an embodiment, the upper stage 400 may include magnetic sensors 410 and probe units 420. Also, referring to FIGS. 3 and 4, the mother substrate MSUB may be prepared so as to manufacture a display panel DP in accordance with an embodiment of the present disclosure. The mother substrate MSUB may include probe pads PP and substrate lines SL1 and SL2.

The magnetic sensors 410 may be located on the upper stage 400 to be spaced apart from each other. In an example, the magnetic sensors may be located to be spaced apart from each other in a row direction (e.g., a first direction DR1) and be located to be spaced apart from each other in a column direction (e.g., a second direction DR2), thereby being located in a matrix form. However, the present disclosure is not limited thereto, and an arrangement of the magnetic sensors 410 may be variously changed.

When an alignment voltage is applied to the display panel DP, the magnetic sensor 410 may sense an alignment state of light emitting elements by sensing a magnetic field change occurring at both end portions of the light emitting elements. In an embodiment, the magnetic sensor 410 may be implemented as a hole sensor, a magnetoresistive (MR) sensor, or the like, and may include a metal or a semiconductor material.

A size and/or a shape of the magnetic sensor 410 may be determined corresponding to a unit sensing area of the display panel. The unit sensing area refers to an area (e.g., a predetermined area) defined to appropriately sense an alignment state of the light emitting elements on the display panel. In an example, the magnetic sensor 410 is illustrated in a quadrangular shape, but the present disclosure is not limited thereto. In some embodiments, the magnetic sensor 410 may be variously implemented to correspond to the unit sensing area on the display panel, such as any of a circular shape, a triangular shape, and a cross shape. Various shapes of the magnetic sensor 410 will be described in further detail with reference to FIGS. 7 to 9 which will be described further later.

The probe unit 420 may be located at both sides on the upper stage 400 to be spaced apart from the magnetic sensors 410 on the upper stage 400. Locations and/or a number of the probe units 420 may be determined corresponding to the probe pads PP. For example, the location of the probe unit 420 may be disposed to overlap with the probe pad PP, and the number of the probe units 420 may be equal to a number of the probe pads PP.

The probe unit 420 may provide an alignment voltage to the display panel DP. That is, the probe unit 420 may be in direct contact with the probe pad PP, and may provide the alignment voltage to the display panel DP through the probe pad PP, the substrate lines SL1 and SL, and voltage lines PL1 and PL2.

The probe unit 420 may include a first probe unit 421 and a second probe unit 422. The probe pad PP may include a first probe pad PP1 and a second probe pad PP2. The substrate lines SL1 and SL2 may include a first substrate line SL1 and a second substrate line SL2, and the voltage lines PL1 and PL2 may include a first voltage line PL1 and a second voltage line PL2.

The first probe unit 421 may be in direct contact with the first probe pad PP1, and the second probe unit 422 may be in direct contact with the second probe pad PP2. For example, the first probe unit 421 may provide a ground voltage, and the second probe unit 422 may provide an AC voltage. Accordingly, the ground voltage may be provided to the first probe pad PP1, and the AC voltage may be provided to the second probe pad PP2.

The first substrate line SL1 may be physically and/or electrically connected to the first probe pad PP1, and the second substrate line SL2 may be physically and/or electrically connected to the second probe pad PP2. Also, the first substrate line SL1 may be physically and/or electrically connected to the first voltage line PL1, and the second substrate line SL2 may be physically and/or electrically connected to the second voltage line PL2. Accordingly, when the ground voltage is provided to the first probe pad PP1, the ground voltage may be applied to the first substrate line SL1 and the first voltage line PL1. When the AC voltage is provided to the second probe pad PP2, the AC voltage may be applied to the second substrate line SL2 and the second voltage line PL2.

In an embodiment, the display panel DP may include a pad part PAD, the voltage lines PL1 and PL2, a first electrode REL1, a second electrode REL2, and light emitting elements LD.

The pad part PAD may be physically and/or electrically connected to the first voltage line PL1 and the second voltage line PL2. The pad part PAD may receive an AC voltage and a DC voltage, which are provided from the first voltage line PL1 and the second voltage line PL2. Also, the pad part PAD may provide a driving voltage and a driving low voltage respectively to the first voltage line PL1 and the second voltage line PL2, after the light emitting elements LD are aligned.

The first electrode REL1 and the second electrode REL2 may be disposed on the display panel DP while being spaced apart from each other. When an alignment voltage is applied to each of the first electrode REL1 and the second electrode REL2, the light emitting element LD may be disposed between the first electrode REL1 and the second electrode REL2.

The first electrode REL1 may be electrically connected to the first voltage line PL1, and the second electrode REL2 may be electrically connected to the second voltage line PL2. In order to align the light emitting element LD, the alignment voltage may be applied to the first electrode REL1 and the second electrode REL2. For example, the DC voltage (or ground voltage) may be applied to the first electrode REL1 through the first voltage line PL1, and the AC voltage may be applied to the second electrode REL2 through the second voltage line PL2. A magnetic field may be formed at both ends of the light emitting element LD, corresponding to the AC voltage, and a magnetic field change may occur. The alignment direction of the light emitting element LD may be changed according to a signal pulse. For example, a first end portion of the light emitting element LD may be disposed to face the first electrode REL1, and a second end portion of the light emitting element LD may be disposed to face the second electrode REL2. In an embodiment, the first end portion of the light emitting element LD may be disposed to face the second electrode REL2, and the second end portion of the light emitting element LD may be disposed to face the first electrode REL1.

In an embodiment, when the light emitting element LD is aligned (i.e. rightly aligned), a magnetic field change may occur at both the end portions of the light emitting element LD. Accordingly, when the magnetic field change of the light emitting element LD is sensed through the magnetic sensor 410, the display panel manufacturing apparatus may determine that the light emitting element LD has been rightly aligned. When the magnetic field change of the light emitting element LD is not sensed through the magnetic sensor 410, the display panel manufacturing apparatus may determine that the light emitting element has been misaligned. In an embodiment, when the light emitting element LD is aligned in a forward direction between the first electrode REL1 and the second electrode REL2, the magnetic field change may be sensed, and, therefore, the display panel manufacturing apparatus may determine that the light emitting element LD has been rightly aligned. When the light emitting element LD is aligned in a reverse direction between the first electrode REL1 and the second electrode REL2, the display panel manufacturing apparatus may determine that the light emitting element LD has been misaligned.

In an embodiment, an alignment state of the light emitting element LD may be determined in a process of aligning the light emitting element LD. Thus, a display panel manufacturing process can be simplified, and a display panel manufacturing time can be shortened.

Herein, a display panel manufacturing method in an embodiment of the present disclosure will be described with reference to FIGS. 4 to 6.

Figure 4:
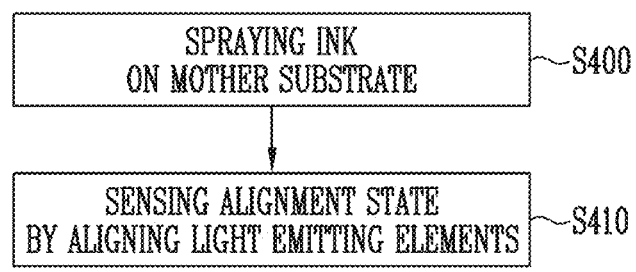
FIG. 4 is a flowchart illustrating a display panel manufacturing method in accordance with an embodiment of the present disclosure.

FIG. 4 is a flowchart illustrating a display panel manufacturing method in accordance with an embodiment of the present disclosure. FIGS. 5 and 6 are cross-sectional views illustrating a display panel manufacturing method in accordance with an embodiment of the present disclosure. FIGS. 5 and 6 are described with reference to FIGS. 1 to 3 described above.

Referring to FIG. 4, a display panel manufacturing method in accordance with an embodiment of the present disclosure may include a step S400 of spraying an ink including light emitting elements on a mother substrate and a step S410 of sensing an alignment state of the light emitting elements by aligning the light emitting elements on the mother substrate.

Figure 5:
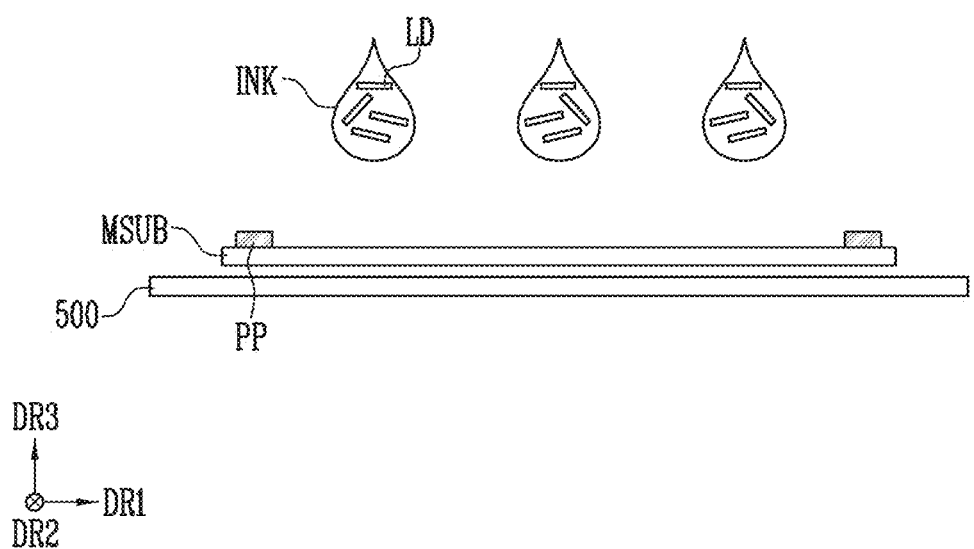
FIGS. 5 and 6 are cross-sectional views illustrating a display panel manufacturing method in accordance with an embodiment of the present disclosure.

Referring to FIG. 5, in a display panel manufacturing method in accordance with an embodiment of the present disclosure, a mother substrate MSUB may be disposed on a lower stage 500, and an ink INK including light emitting elements LD may be sprayed on the mother substrate MSUB.

The ink INK may include a solvent and a solid, and the solid may include a plurality of light emitting elements LD. In an embodiment, the solvent may be a material which is configured with acetone, water, alcohol, pgmea, toluene, etc., and is evaporated or volatilized by room temperature or heat. The solvent of the ink INK may be evaporated through a heat treatment process or the like, after the light emitting elements LD are aligned.

Figure 6:
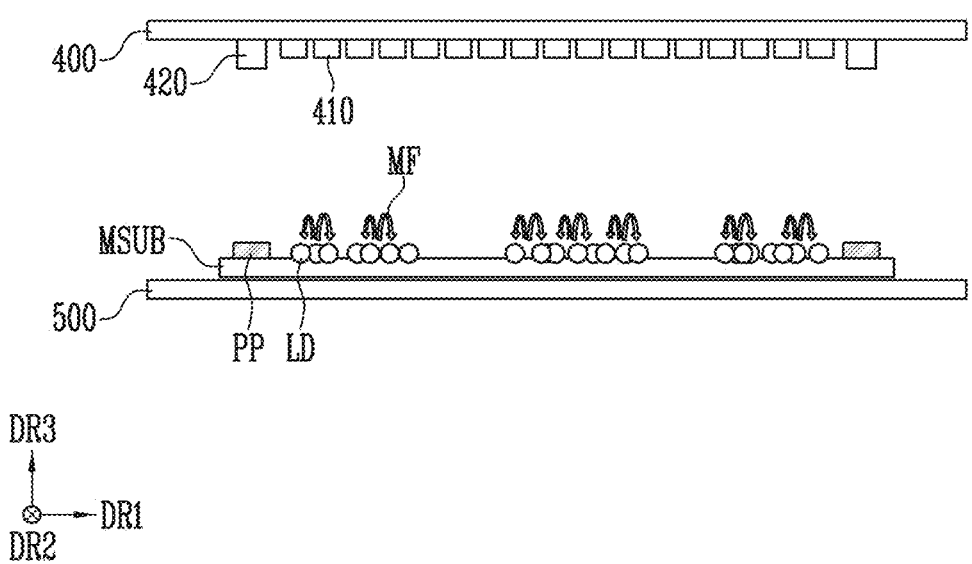

Referring to FIG. 6, in the display panel manufacturing method in accordance with an embodiment of the present disclosure, an alignment voltage for aligning the light emitting elements LD may be applied to the mother substrate MSUB, and an alignment state of the light emitting element LD may be sensed by sensing a magnetic field of the light emitting element LD.

In the display panel manufacturing apparatus, the upper stage 400 may be located to overlap with the lower stage 500. The magnetic sensor 410 and the probe unit 420 of the upper stage 400 may be disposed to face a probe pad PP and the light emitting elements LD of the lower stage 500. That is, the magnetic sensor 410 may be disposed to face an area on which the light emitting elements LD are sprayed, and the probe unit 420 may be disposed to face the probe pad PP.

In the display panel manufacturing apparatus, the upper stage 400 may be moved in a third direction DR3 such that the probe unit 420 is in direct contact with the probe pad PP. Accordingly, the probe unit 420 may provide the alignment voltage (i.e. a DC voltage and an AC voltage) to the probe pad PP. In an embodiment, as described with reference to FIGS. 2 and 3, the first probe unit 421 may provide a first alignment voltage to the first probe pad PP1, and the second probe unit 422 may provide a second alignment voltage to the second probe pad PP2. The first alignment voltage may be applied to the first electrode REL1 through the first probe pad PP1, and the second alignment voltage may be applied to the second electrode REL2 through the second probe pad PP2. In an embodiment, the first alignment voltage may be the DC voltage, and the second alignment voltage may be the AC voltage. However, the present disclosure is not limited thereto. In an embodiment, the first alignment voltage may be the AC voltage, and the second alignment voltage may be the DC voltage.

A magnetic field MF may be formed at both ends of the light emitting element LD, corresponding to a voltage change of the first electrode REL1 and the second electrode REL2, and a magnetic field change may occur. When the magnetic field of the light emitting element LD is sensed through the magnetic sensor 410, the display panel manufacturing apparatus may determine that the light emitting element LD has been aligned (i.e. rightly aligned). When the magnetic field change of the light emitting element LD is not sensed, the display panel manufacturing apparatus may determine that the light emitting element LD has been misaligned. In an embodiment, when the light emitting element LD is aligned in the forward direction between the first electrode REL1 and the second electrode REL2, the magnetic field change may be sensed, and, therefore, the display panel manufacturing apparatus may determine that the light emitting element LD has been misaligned.

The light emitting elements LD may be aligned in a direction (e.g., a predetermined direction) by a difference in alignment voltage between the first electrode REL1 and the second electrode REL2. For example, at least a portion of a first end portion of the light emitting element LD may be disposed at the first electrode REL1 to overlap with the first electrode REL1, and at least a portion of a second end portion of the light emitting element LD may be disposed at the second electrode REL2 to overlap with the second electrode REL2. That is, when the first end portion of the light emitting element LD is located at the first electrode REL1 and the second end portion of the light emitting element LD is located at the second electrode REL2, it may be determined that the light emitting element LD has been rightly aligned (or aligned in the forward direction). On the other hand, when the first end portion of the light emitting element LD and the second end portion of the light emitting element LD do not respectively overlap with the first electrode REL1 and the second electrode REL2 or when the first end portion of the light emitting element LD and the second end portion of the light emitting element LD are aligned in different directions, it may be determined that the light emitting element LD has been misaligned (or aligned in the reverse direction).

In an embodiment, an alignment state of the light emitting element LD may be determined in a process of aligning the light emitting element LD. Thus, a display panel manufacturing process can be simplified, and a display panel manufacturing time can be shortened.

Herein, various shapes of the magnetic sensor will be described with reference to FIGS. 7 to 9.

Figure 7:
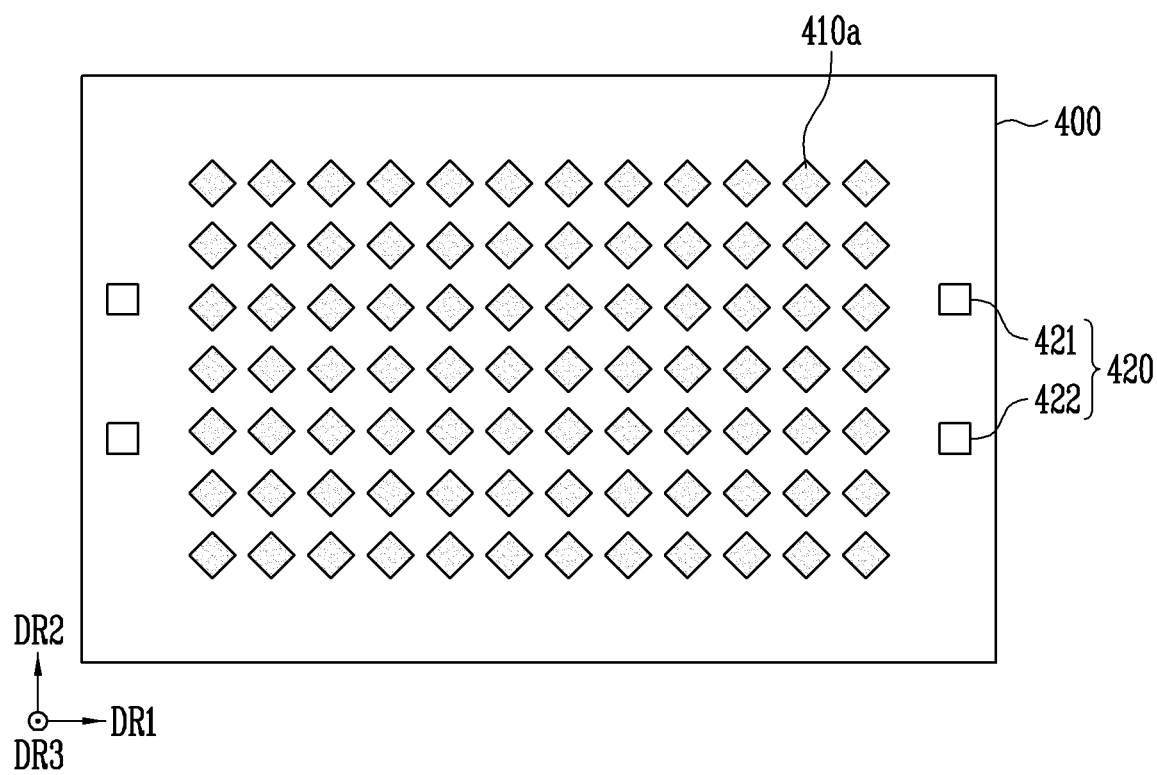
FIGS. 7 to 9 are plan views illustrating an upper stage of a display panel manufacturing apparatus in accordance with some embodiments of the present disclosure.
Figure 8:
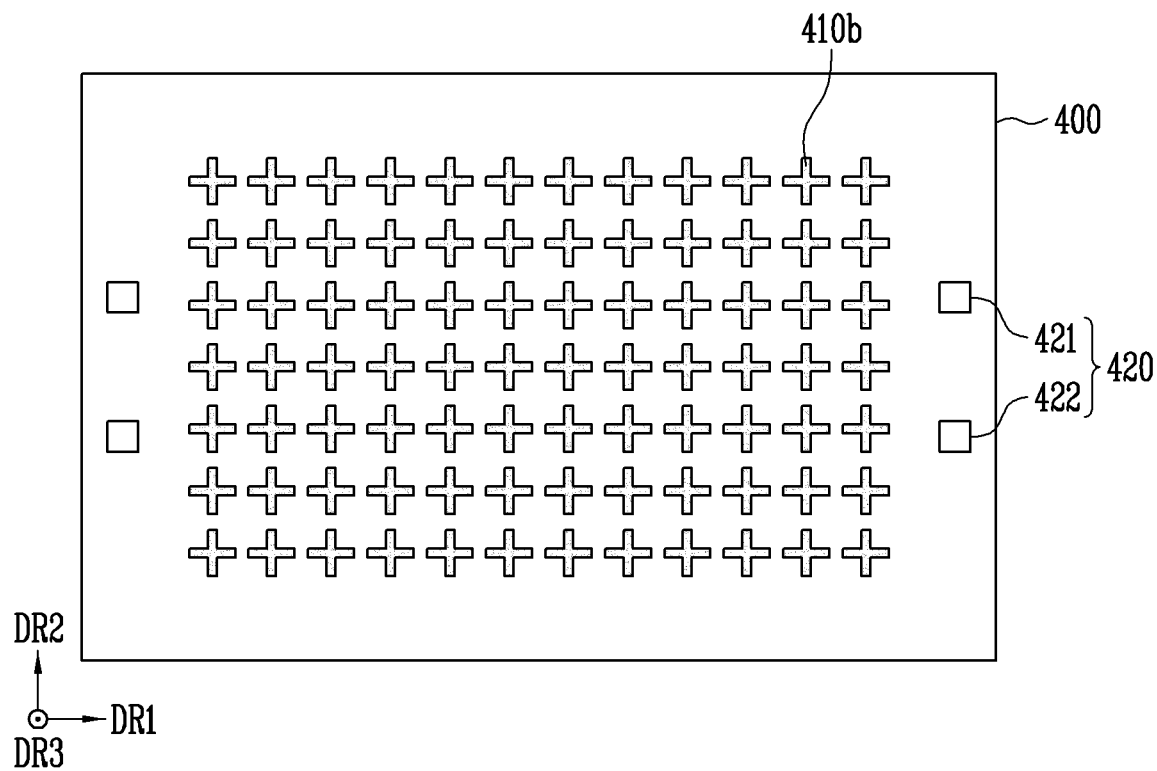
Figure 9:
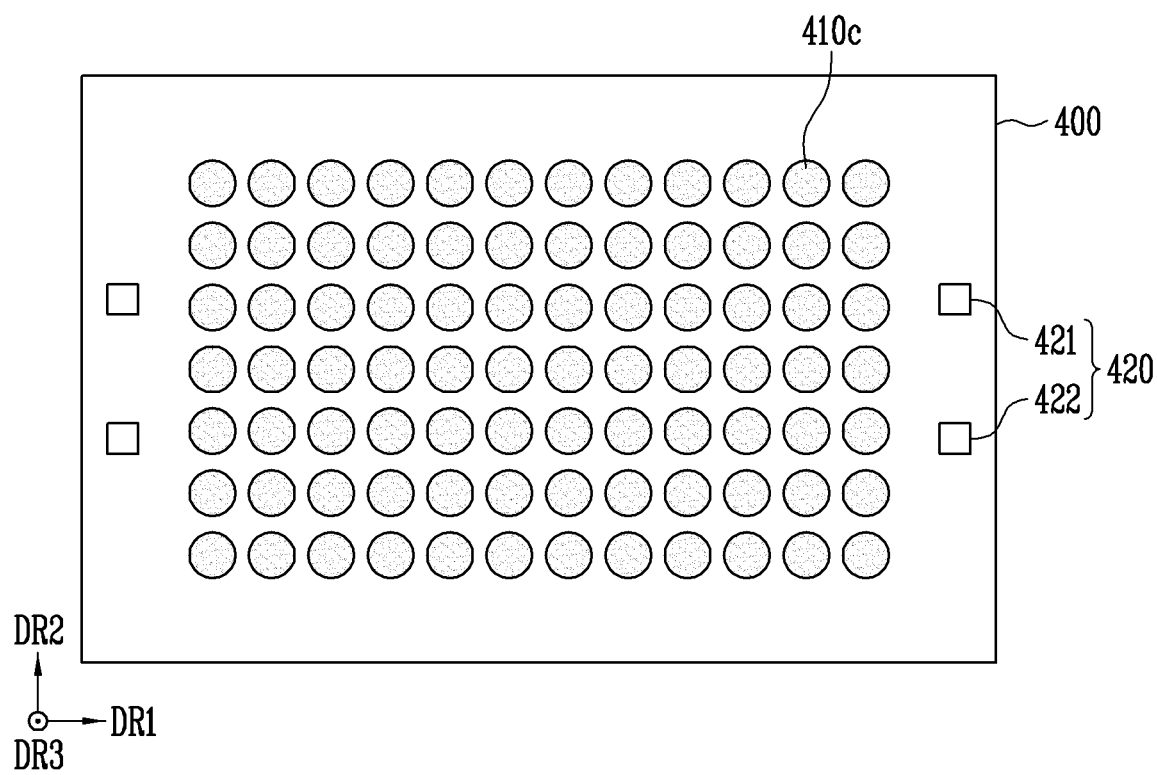

FIGS. 7 to 9 are plan views illustrating an upper stage of the display panel manufacturing apparatus in accordance with some embodiments of the present disclosure. The plan views shown in FIGS. 7 to 9 are similar to the plan view shown in FIG. 2. Therefore, portions different from those shown in FIG. 2 will be mainly described to avoid redundancy.

Referring to FIG. 7, magnetic sensors 410a may be located on the upper stage 400 to be spaced apart from each other. For example, twelve magnetic sensors 410a may be located to be spaced apart from each other in the first direction DR1, and seven magnetic sensors 410a may be located to be spaced apart from each other in the second direction DR2, thereby being located in a matrix form.

In an embodiment, the magnetic sensors 410a may have a rhombic shape. In an embodiment, sizes of the magnetic sensors 410a may all be the same. However, the present disclosure is not limited thereto, and the sizes of the magnetic sensors 410a may be implemented different from each other according to a unit sensing area of a display panel.

Referring to FIG. 8, magnetic sensors 410b may be located on the upper stage 400 to be spaced apart from each other. For example, twelve magnetic sensors 410b may be located to be spaced apart from each other in the first direction DR1, and seven magnetic sensors 410b may be located to be spaced apart from each other in the second direction DR2, thereby being located in a matrix form.

In an embodiment, the magnetic sensors 410b may have a cross shape. In an embodiment, sizes of the magnetic sensors 410b may all be the same. However, the present disclosure is not limited thereto, and the sizes of the magnetic sensors 410b may be implemented different from each other according to a unit sensing area of a display panel.

Referring to FIG. 9, magnetic sensors 410c may be located on the upper stage 400 to be spaced apart from each other and may have a circular shape. For example, twelve magnetic sensors 410c may be located to be spaced apart from each other in the first direction DR1, and seven magnetic sensors 410c may be located to be spaced apart from each other in the second direction DR2, thereby being located in a matrix form.

In an embodiment, the display panel manufacturing apparatus incudes the magnetic sensor 410a, 410b, or 410c on the upper stage 400, and, therefore, a magnetic field change of the light emitting element LD may be sensed through the magnetic sensor 410a, 410b, or 410c. That is, in an embodiment, an alignment state of the light emitting element LD may be determined in a process of aligning the light emitting element LD. Thus, a display panel manufacturing process can be simplified, and a display panel manufacturing time can be shortened.

Herein, a display panel and a light emitting element in accordance with an embodiment of the present disclosure will be described with reference to FIGS. 10 to 12.

Figure 10:
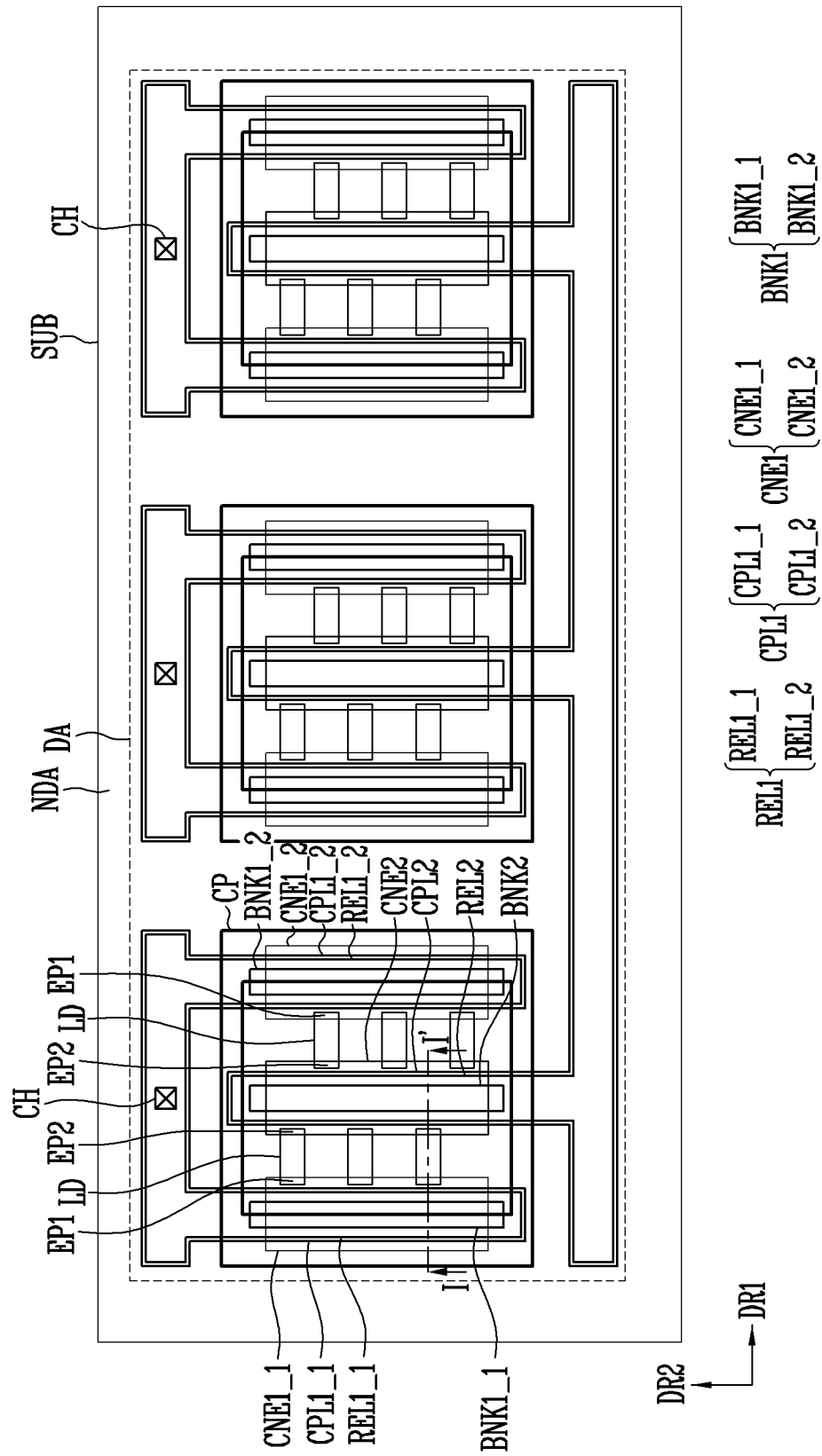
FIG. 10 is a plan view illustrating a display panel in accordance with an embodiment of the present disclosure.

FIG. 10 is a plan view illustrating a display panel in accordance with an embodiment of the present disclosure. FIG. 11 is a cross-sectional view illustrating an area shown in FIG. 10. FIG. 12 is a perspective view illustrating a light emitting element included in the display panel in accordance with an embodiment of the present disclosure.

Referring to FIG. 10, a display panel in accordance with an embodiment of the present disclosure may include a first bank BNK1, a second bank BNK2, a first electrode REL1, a second electrode REL2, a first capping layer CPL1, a second capping layer CPL2, a conductive pattern CP, light emitting elements LD, a first contact electrode CNE1, and a second contact electrode CNE2.

A substrate SUB may include a display area DA in which an image is displayed and a non-display area NDA in which the image is not displayed. The substrate SUB may be a rigid or flexible substrate or film, and a material or property of the substrate SUB is not particularly limited. In an example, the substrate SUB may be a rigid substrate made of glass or tempered glass, a flexible substrate (or thin film) made of a plastic or metal material, or at least one insulating layer. The material and/or property of the substrate SUB is not particularly limited. Also, the substrate SUB may correspond to a portion obtained by cutting the mother substrate MSUB described with reference to FIG. 3 to correspond to one display panel DP.

The first bank BNK1 and the second bank BNK2 may be located in the display area DA. The first bank BNK1 may include a (1-1)th bank BNK1_1 and a (1-2)th bank BNK1_2, and the second bank BNK2 may be located between the (1-1)th bank BNK1_1 and the (1-2)th bank BNK1_2 to be spaced apart from the (1-1)th bank BNK1_1 and the (1-2)th bank BNK1_2.

The first electrode REL1 may overlap with the first bank BNK1, and may include a (1-1)th electrode REL1_1 and a (1-2)th electrode REL1_2. The first electrode REL1 may extend in the first direction DR1 and the second direction DR2. The (1-1)th electrode REL1_1 and the (1-2)th electrode REL1_2, which extend in the second direction DR2, may respectively overlap with the (1-1)th bank BNK1_1 and the (1-2)th bank BNK1_2.

The second electrode REL2 may overlap with the second bank BNK2, and may extend in the first direction DR1 and the second direction DR2. The second electrode REL2 extending in the second direction DR2 may constitute a second electrode REL2 of each sub-pixel.

In an embodiment, when different voltages are respectively applied to the first electrode REL1 and the second electrode REL2, an electric field and a magnetic field may be formed between the first electrode REL1 and the second electrode REL2. In an example, a ground voltage may be applied to the first electrode REL1, and an AC voltage may be applied to the second electrode REL2. Accordingly, the light emitting elements LD can be aligned in a direction (e.g., a predetermined direction) between the first electrode REL1 and the second electrode REL2. When the ground voltage is applied to the first electrode REL1, a transistor of a pixel circuit layer, which is connected to the first electrode REL1, may not be influenced by a voltage of the first electrode REL1.

In an embodiment, the first electrode REL1 may be an anode, and the second electrode REL2 may be a cathode. However, the present disclosure is not limited thereto. In an embodiment, the first electrode REL1 may be the cathode, and the second electrode REL2 may be the anode.

The first capping layer CPL1 may overlap with the first electrode REL1, and may include a (1-1)th capping layer CPL1_1 and a (1-2)th capping layer CPL1_2.

The second capping layer CPL2 may overlap with the second electrode REL2.

In an embodiment, the conductive pattern CP may be located in a shape surrounding an edge of the first electrode REL1 and the second electrode REL2. The conductive pattern CP may be a structure capable of defining an emission area in which the light emitting elements LD are aligned.

The light emitting elements LD may be aligned in the direction (e.g., the predetermined direction) by the electric field and the magnetic field, which are formed between the first electrode REL1 and the second electrode REL2. For example, a first end portion EP1 of the light emitting element LD may be aligned to face the first electrode REL1, and a second end portion EP2 of the light emitting element LD may be aligned to face the second electrode REL2.

The first contact electrode CNE1 may include a (1-1)th contact electrode CNE1_1 and a (1-2)th contact electrode CNE1_2. At least a portion of the (1-1)th contact electrode CNE1_1 may overlap with the light emitting element LD and the (1-1)th electrode REL1_1. The (1-1)th contact electrode CNE1_1 may electrically and/or physically connect the first end portion EP1 of the light emitting element LD and the (1-1)th electrode REL1_1 to each other. At least a portion of the (1-2)th contact electrode CNE1_2 may overlap with the light emitting element LD and the (1-2)th electrode REL1_2. The (1-2)th contact electrode CNE1_2 may electrically and/or physically connect the first end portion EP1 of the light emitting element LD and the (1-2)th electrode REL1_2 to each other.

At least a portion of the second contact electrode CNE2 may overlap with the light emitting element LD and the second electrode REL2. The second contact electrode CNE2 may electrically and/or physically connect the second end portion EP2 of the light emitting element LD and the second electrode REL2 to each other.

Figure 11:
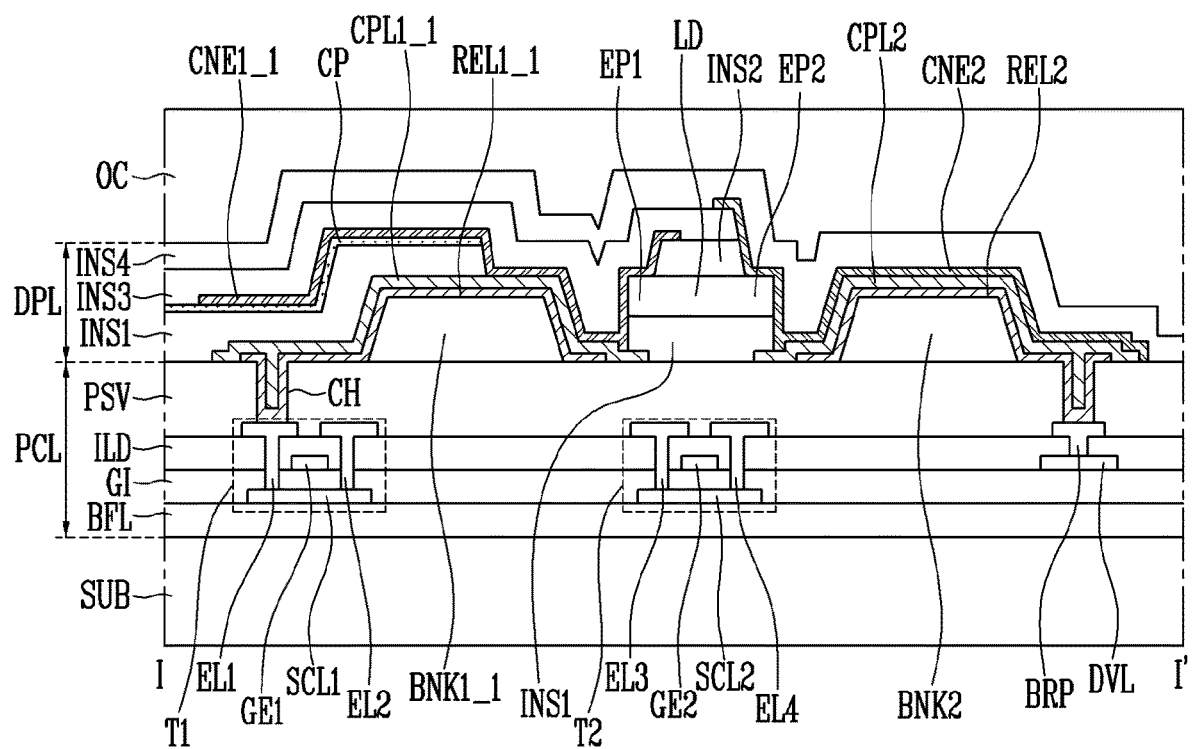
FIG. 11 is a cross-sectional view illustrating an area shown in FIG. 10.

Referring to FIG. 11, the display panel in accordance with an embodiment of the present disclosure may include a pixel circuit layer PCL, a display element layer DPL, and an overcoat layer OC, which are located on the substrate SUB.

The pixel circuit layer PCL may include at least one transistor and a plurality of lines connected thereto. Also, the pixel circuit layer PCL may include a buffer layer BFL and a plurality of insulating layers GI, ILD, and PSV, which are sequentially stacked on the substrate SUB.

The buffer layer BFL is located on the substrate SUB to cover the substrate SUB. The buffer layer BFL may prevent or substantially prevent an impurity from being diffused into the pixel circuit layer PCL from the outside. The buffer layer BFL may include at least one of silicon nitride ($SiN_x$), silicon oxide ($SiO_x$), silicon oxynitride ($SiO_xN_y$), and metal oxide, such as aluminum oxide ($AlO_x$). In some embodiments, the buffer layer BFL may be omitted. A bottom metal layer may be located between the substrate SUB and the buffer layer BFL.

A first transistor T1 may include a first semiconductor pattern SCL1, a first gate electrode GE1, a first source electrode EL1, and a first drain electrode EL2. A second transistor T2 may include a second semiconductor pattern SCL2, a second gate electrode GE2, a second source electrode EL3, and a second drain electrode EL4.

The first semiconductor pattern SCL1 and the second semiconductor pattern SCL2 may be located on the buffer layer BFL. Each of the first semiconductor pattern SCL1 and the second semiconductor pattern SCL2 may include a channel region, and a source region and a drain region, which are located at both sides of the channel region. A source region of the first semiconductor pattern SCL1 may be electrically connected to the first source electrode EL1, and a drain region of the first semiconductor pattern SCL1 may be electrically connected to the first drain electrode EL2. A source region of the second semiconductor pattern SCL2 may be electrically connected to the second source electrode EL3, and a drain region of the second semiconductor pattern SCL2 may be electrically connected to the second drain electrode EL4. That is, the source region and the drain region may extend to be electrically connected respectively to electrodes in another layer through contact holes.

In an embodiment, the first semiconductor pattern SCL1 and the second semiconductor pattern SCL2 may include at least one of poly-silicon, amorphous silicon, and an oxide semiconductor.

A gate insulating layer GI among the plurality of insulating layers GI, ILD, and PSV is located on the first semiconductor pattern SCL1, the second semiconductor pattern SCL2, and the buffer layer BFL. The gate insulating layer GI may cover the first semiconductor pattern SCL1, the second semiconductor pattern SCL2, and the buffer layer BFL.

In an embodiment, the gate insulating layer GI may include an inorganic material. In an example, the gate insulating layer GI may include at least one of silicon nitride ($SiN_x$), silicon oxide ($SiO_x$), silicon oxynitride ($SiO_xN_y$), and aluminum oxide ($AlO_x$). In some embodiments, the gate insulating layer GI may include an organic material.

The first gate electrode GE1 and the second gate electrode GE2 are located on the gate insulating layer GI. The first gate electrode GE1 and the second gate electrode GE2 may be located to respectively overlap with the channel regions of the first semiconductor pattern SCL1 and the second semiconductor pattern SCL2.

A driving voltage line DVL may be located on the insulating layer GI.

An interlayer insulating layer ILD among the plurality of insulating layers GI, ILD, and PSV is located on the gate insulating layer GI, and may cover the first gate electrode GE1, the second gate electrode GE2, and the gate insulating layer GI. In an embodiment, the interlayer insulating layer ILD may include the same material as the gate insulating layer GI. That is, the interlayer insulating layer ILD may include an inorganic material or an organic material.

The first source electrode EL1 and the first drain electrode EL2 may be located on the interlayer insulating layer ILD. The first source electrode EL1 may be physically and/or electrically connected to the first electrode REL1 through a contact hole CH of a protective layer PSV which will be described later.

The second source electrode EL3 and the second drain electrode EL4 may be located on the interlayer insulating layer ILD. A bridge electrode BRP may be located on the interlayer insulating layer ILD. The bridge electrode BRP may be physically and/or electrically connected to the second electrode REL2 through a contact hole of the protective layer PSV which will be described later.

The protective layer PSV may be located over the first source electrode EL1, the first drain electrode EL2, the second source electrode EL3, the second drain electrode EL4, and the bridge electrode BRP. In an embodiment, the protective layer PSV may include at least one organic insulating layer. The protective layer PSV may be configured as a single layer or a multi-layer, and include an inorganic insulating material and an organic insulating material. For example, the protective layer PSV may include at least one of a polyacrylate resin, an epoxy resin, a phenolic resin, a polyamide resin, and a polyimide resin.

The display element layer DPL may include the first bank BNK1, the second bank BNK2, the first electrode REL1, the second electrode REL2, the first capping layer CPL1, the second capping layer CPL2, the conductive pattern CP, the light emitting elements LD, the first contact electrode CNE1, the second contact electrode CNE2, and a plurality of insulating layers INS1, INS2, INS3, and INS4.

The first bank BNK1 and the second bank BNK2 may be located on the protective layer PSV. In an embodiment, the first bank BNK1 and the second bank BNK2 may include an organic insulating material.

The first electrode REL1 may be located on the first bank BNK1. The (1-1)th electrode REL1_1 may be located on the (1-1)th bank BNK1_1. The (1-1)th electrode REL1_1 may be physically and/or electrically connected to the first source electrode EL1 through the contact hole CH of the protective layer PSV.

The second electrode REL2 may be located on the second bank BNK2. The second electrode REL2 may be physically and/or electrically connected to the bridge electrode BRP through the contact hole of the protective layer PSV.

The first electrode REL1 and the second electrode REL2 may include a transparent conductive oxide, such as indium tin oxide (ITO), indium zinc oxide (IZO), zinc oxide (ZnO), indium gallium zinc oxide (IGZO), or indium tin zinc oxide (ITZO). However, the present disclosure is not limited thereto. In some embodiments, the first electrode REL1 and the second electrode REL2 may include an opaque metal using one or a mixture of magnesium (Mg), aluminum (Al), silver (Ag), gold (Au), copper (Cu), tin (Sn), platinum (Pt), palladium (Pd), nickel (Ni), neodymium (Nd), iridium (Ir), chromium (Cr), titanium (Ti), or any alloy thereof.

The first capping layer CPL1 may be located on the first electrode REL1 to be in direct contact with the first electrode REL1. In an embodiment, the (1-1)th capping layer CPL1_1 may be located on the (1-1)th electrode REL1_1 to be in direct contact with the (1-1)th electrode REL1_1.

In an embodiment, the second capping layer CPL2 may be located on the second electrode REL2 to be in direct contact with the second electrode REL2.

In an embodiment, the first capping layer CPL1 and the second capping layer CPL2 may include the same material as the first electrode REL1 and the second electrode REL2. For example, the first capping layer CPL1 and the second capping layer CPL2 may include a transparent conductive oxide, such as indium tin oxide (ITO), indium zinc oxide (IZO), zinc oxide (ZnO), indium gallium zinc oxide (IGZO), or indium tin zinc oxide (ITZO). However, the present disclosure is not limited thereto. In some embodiments, the first capping layer CPL1 and the second capping layer CPL2 may include an opaque metal using one or a mixture of magnesium (Mg), aluminum (Al), silver (Ag), gold (Au), copper (Cu), tin (Sn), platinum (Pt), palladium (Pd), nickel (Ni), neodymium (Nd), iridium (Ir), chromium (Cr), titanium (Ti), or any alloy thereof.

A first insulating layer INS1 among the plurality of insulating layers INS1, INS2, INS3, and INS4 may be located to partially cover the (1-1)th capping layer CPL1_1, and may be partially located on the protective layer PSV.

The first insulating layer INS1 may include at least one of silicon nitride ($SiN_x$), silicon oxide ($SiO_x$), silicon oxynitride ($SiO_xN_y$), and aluminum oxide ($AlO_x$). In some embodiments, the first insulating layer INS1 may include an organic material.

A second insulating layer INS2 among the plurality of insulating layers INS1, INS2, INS3, and INS4 may be located on the light emitting element LD, and may expose the first end portion EP1 and the second end portion EP2 of the light emitting element LD. The second insulating layer INS2 may include at least one of silicon nitride ($SiN_x$), silicon oxide ($SiO_x$), silicon oxynitride ($SiO_xN_y$), and aluminum oxide ($AlO_x$). In some embodiments, the second insulating layer INS2 may include an organic material.

The light emitting element LD may be located on the second insulating layer INS2.

The conductive pattern CP may be located on the first insulating layer INS1, and be made of a conductive material, such as molybdenum (Mo).

The first contact electrode CNE1 may be located on the conductive pattern CP, the (1-1)th capping layer CPL1_1, the first end portion EP1 of the light emitting element LD, and the second insulating layer INS2. The first contact electrode CNE1 may be in direct contact with the first end portion EP1 of the light emitting element LD and may be in direct contact with the (1-1)th capping layer CPL1_1, thereby providing a voltage provided from the (1-1)th electrode REL1_1 to the first end portion EP1 of the light emitting element LD.

A third insulating layer INS3 among the plurality of insulating layers INS1, INS2, INS3, and INS4 may be located over the second insulating layer INS2 and the (1-1)th contact electrode CNE1_1, and may be located to cover the second insulating layer INS2 and the (1-1)th contact electrode CNE1_1.

The third insulating layer INS3 may include at least one of silicon nitride ($SiN_x$), silicon oxide ($SiO_x$), silicon oxynitride ($SiO_xN_y$), and aluminum oxide ($AlO_x$). In some embodiments, the third insulating layer INS3 may include an organic material.

The second contact electrode CNE2 may be located on the second capping layer CPL2, the second end portion EP2 of the light emitting element LD, and the third insulating layer INS3. In an embodiment, the second contact electrode CNE2 may be in direct contact with the second end portion EP2 of the light emitting element LD and may be in direct contact with the second capping layer CPL2, thereby providing a voltage provided from the second electrode REL2 to the second end portion EP2 of the light emitting element LD.

In an embodiment, the first contact electrode CNE1 and the second contact electrode CNE2 may include a transparent conductive oxide. However, the present disclosure is not limited thereto, and, in an embodiment, the first contact electrode CNE1 and the second contact electrode CNE2 may include an opaque metal.

A fourth insulating layer INS4 among the plurality of insulating layers INS1, INS2, INS3, and INS4 may be located over the third insulating layer INS3 and the second contact electrode CNE2, and may be located to cover the third insulating layer INS3 and the second contact electrode CNE2.

In an embodiment, the fourth insulating layer INS4 may include at least one of silicon nitride ($SiN_x$), silicon oxide ($SiO_x$), silicon oxynitride ($SiO_xN_y$), and aluminum oxide ($AlO_x$). In some embodiments, the fourth insulating layer INS4 may include an organic material.

The overcoat layer OC may be located on the fourth insulating layer INS4. The overcoat layer OC may be a planarization layer for reducing step differences generated by the first bank BNK1, the second bank BNK2, the first electrode REL1, the second electrode REL2, the first contact electrode CNE1, and the second contact electrode CNE2. In an embodiment, the overcoat layer OC may be an encapsulation layer for preventing or substantially preventing oxygen, moisture, and the like from infiltrating into the light emitting elements LD.

Figure 12:
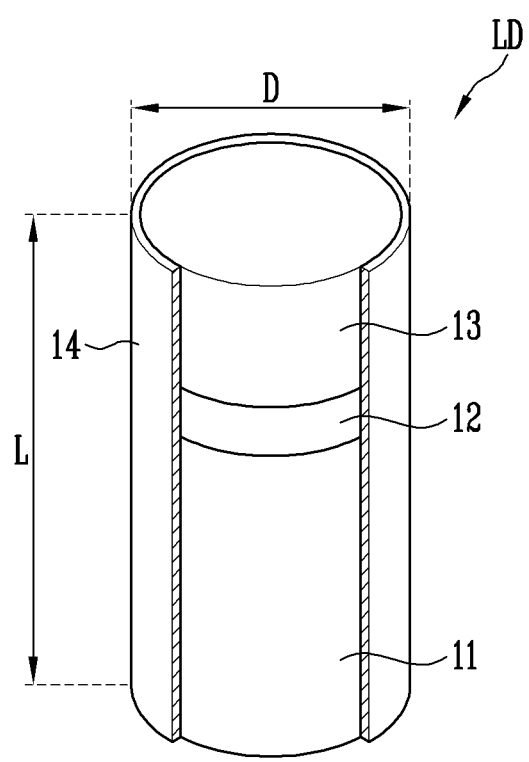
FIG. 12 is a perspective view illustrating a light emitting element included in the display panel in accordance with an embodiment of the present disclosure.

Referring to FIG. 12, the light emitting element LD included in the display device in accordance with an embodiment of the present disclosure includes a first semiconductor layer 11, a second semiconductor layer 13, and an active layer 12 located between the first semiconductor layer 11 and the second semiconductor layer 13. In an example, the light emitting element LD may be configured as a stack structure in which the first semiconductor layer 11, the active layer 12, and the third semiconductor layer 13 are sequentially stacked along a length L direction.

In an embodiment, the light emitting element LD may be provided in a rod shape extending in a direction, i.e., a cylindrical shape.

When assuming that an extending direction of the light emitting element LD is the length L direction, the light emitting element LD may have one end portion and another end portion along the length L direction. Although a pillar-shaped light emitting element LD is illustrated in FIG. 12, a kind and/or shape of the light emitting element LD in accordance with embodiments of the present disclosure is not limited thereto.

In an embodiment, the first semiconductor layer 11 may include at least one n-type semiconductor layer. For example, the first semiconductor layer 11 may include a semiconductor material among InAlGaN, GaN, AlGaN, InGaN, AlN, and InN, and may be an n-type semiconductor layer doped with a first conductivity type dopant, such as Si, Ge, or Sn. However, a material constituting the first semiconductor layer 11 is not limited thereto. That is, the first semiconductor layer 11 may be configured with various materials.

The active layer 12 is disposed on the second semiconductor layer 13, and may be formed in a single-quantum well structure or a multi-quantum well structure. In an embodiment, a clad layer (not shown) doped with a conductive dopant may be formed on the top and/or the bottom of the active layer 12. In an example, the clad layer may be formed as an AlGaN layer or an InAlGaN layer. In some embodiments, a material such as AlGaN or AlInGaN may be used to form the active layer 12. In addition, the active layer 12 may be configured with various materials.

When a voltage equal to or higher than a threshold voltage is applied to both ends of the light emitting element LD, the light emitting element LD emits light as electron-hole pairs are combined in the active layer 12. The light emission of the light emitting element LD is controlled by using such a principle, such that the light emitting element LD can be used as a light source for various light emitting devices, including a pixel of a display device.

The second semiconductor layer 13 may be disposed on the active layer 12, and may include a semiconductor layer of a type different from the type of the first semiconductor layer 11. In an example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a P-type semiconductor layer doped with a second conductivity type dopant, such as Mg, Zn, Ca, Sr or Ba. However, a material constituting the second semiconductor layer 13 is not limited thereto. In addition, the second semiconductor layer 13 may be formed of various materials.

In the above-described embodiment, it is described that each of the first semiconductor layer 11 and the second semiconductor layer 13 is configured with one layer. However, the present disclosure is not limited thereto. In an embodiment of the present disclosure, each of the first semiconductor layer 11 and the second semiconductor layer 13 may further include at least one layer, e.g., a clad layer and/or a Tensile Strain Barrier Reducing (TSBR) layer according to a material of the active layer 12. The TSBR layer may be a strain reducing layer disposed between semiconductor layers having different lattice structures to perform a buffering function for reducing a lattice constant difference. In an embodiment, the TSBR may be configured with a p-type semiconductor layer, such as p-GAlnP, p-AlInP or p-AlGaInP, but the present disclosure is not limited thereto.

In some embodiments, the light emitting element LD may further include an insulative layer 14 provided on a surface thereof. The insulative film 14 may be formed on the surface of the light emitting element LD to surround an outer circumferential surface of the active layer 12. In addition, the insulative film 14 may further surround an area of each of the first semiconductor layer 11 and the second semiconductor layer 13. However, in some embodiments, the insulative film 14 may expose both end portions of the light emitting element LD, which have different polarities. For example, the insulative film 14 may not cover ends of the first semiconductor layer 11 and the second semiconductor layer 13, which are located at both ends of the light emitting element LD in the length L direction, e.g., two bottom surfaces of a cylinder (e.g., an upper surface and a lower surface of the light emitting element LD), but may expose the ends of the first semiconductor layer 11 and the second semiconductor layer 13.

When the insulative film 14 is provided on the surface of the light emitting element LD, particularly, a surface of the active layer 12, the active layer 12 may be prevented or substantially prevented from being short circuited with at least one electrode (not shown) (e.g., at least one contact electrode among contact electrodes connected to both the ends of the light emitting element LD), etc. Accordingly, the electrical stability of the light emitting element LD can be ensured.

In addition, the light emitting element LD includes the insulative film 14 on the surface thereof, such that a surface defect of the light emitting element LD may be minimized or reduced, thereby improving the lifetime and efficiency of the light emitting element LD. Further, when each light emitting element LD includes the insulative film 14, an unwanted short circuit may be prevented or substantially prevented from occurring between a plurality of light emitting elements LD, even when the light emitting elements LD are densely disposed.

In an embodiment, the light emitting element LD may be manufactured through a surface treatment process. For example, when a plurality of light emitting elements LD are mixed in a liquid solution (or solvent) to be supplied to each emission area (e.g., an emission area of each pixel), each light emitting element LD may be surface-treated such that the light emitting elements LD are not unequally condensed in the solution, but equally dispersed in the solution.

In an embodiment, the light emitting element LD may further include an additional component in addition to the first semiconductor layer 11, the active layer 12, the second semiconductor layer 13, and the insulative film 14. For example, the light emitting element LD may additionally include at least one phosphor layer, at least one active layer, at least one semiconductor layer, and/or at least one electrode layer, which are disposed at an end of the first semiconductor layer 11, the active layer 12, and the second semiconductor layer 13.

The light emitting element LD may be used in various kinds of devices which require a light source, including a display device. For example, at least one light emitting element LD, e.g., a plurality of light emitting elements LD each having a size of nanometer scale to micrometer scale may be disposed in each pixel area of a display device, and a light source (or light source unit) of each pixel may be configured by using the light emitting elements LD. However, the application field of the light emitting element LD is not limited to the display device. For example, the light emitting element LD may be used in other types of devices that require a light source, such as a lighting device.

In accordance with embodiments of the present disclosure, the display panel manufacturing apparatus includes a magnetic sensor, to determine an alignment state of a light emitting element in an alignment process of the light emitting element. Thus, a display panel manufacturing process can be simplified, and a display panel manufacturing time can be shortened.

While some example embodiments are disclosed herein, and although specific terms are employed, they are used and are to be interpreted in a generic and descriptive sense and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display panel manufacturing apparatus for manufacturing a display panel which is on a lower stage and includes light emitting elements, the display panel manufacturing apparatus comprising:
   a power supply configured to supply an alignment voltage for aligning the light emitting elements on the display panel; and
   an upper stage comprising a probe unit to provide the alignment voltage to the display panel and magnetic sensors to sense an alignment state of the light emitting elements.

2. The display panel manufacturing apparatus of claim 1, wherein the magnetic sensors are located on the upper stage while being spaced apart from each other.

3. The display panel manufacturing apparatus of claim 1, wherein, when the alignment voltage is applied, the magnetic sensors sense a magnetic field change occurring at both end portions of the light emitting elements.

4. The display panel manufacturing apparatus of claim 1, wherein the magnetic sensors include a hole sensor or a magnetoresistive sensor.

5. The display panel manufacturing apparatus of claim 1, wherein a size and a shape of the magnetic sensors are determined corresponding to a unit sensing area of the display panel.

6. The display panel manufacturing apparatus of claim 5, wherein the unit sensing area is an area defined to sense the alignment state of the light emitting elements on the display panel.

7. The display panel manufacturing apparatus of claim 1, wherein the probe unit is located at both sides of the upper stage to be spaced apart from the magnetic sensors.

* * * * *